United States Patent
Murakami (12) 
(10) Patent No.: US 6,212,768 B1
(45) Date of Patent: Apr. 10, 2001

(54) FLIP CHIP MOUNTING METHOD AND APPARATUS THEREFOR

(75) Inventor: Tomoo Murakami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/311,185

(22) Filed: May 13, 1999

(30) Foreign Application Priority Data

May 15, 1998 (JP) .................................................. 10-132873
Mar. 29, 1999 (JP) .................................................. 11-085105

(51) Int. Cl.[7] .................................................. H05K 3/34
(52) U.S. Cl. .................................................. 29/840; 29/740; 29/840; 156/73.6; 257/778; 257/780; 257/781; 257/782; 257/783
(58) Field of Search .................... 29/740, 840; 156/73.6; 257/778, 780, 782, 783, 781

(56) References Cited

U.S. PATENT DOCUMENTS

| | | | |
|---|---|---|---|
| 5,814,890 | * 9/1998 | Iwasaki | 257/778 |
| 5,821,625 | * 10/1998 | Yoshida | 257/777 |
| 5,821,627 | * 10/1998 | Mori et al. | 257/780 |
| 5,829,125 | * 11/1998 | Fujimoto et al. | 29/840 |
| 5,850,677 | * 12/1998 | Ryoichi | 29/25.35 |
| 5,861,678 | * 1/1999 | Schrock | 257/783 |
| 5,866,950 | * 2/1999 | Iwasaki et al. | 257/782 |

FOREIGN PATENT DOCUMENTS

| | | |
|---|---|---|
| 57-4223 | 6/1955 | (JP) . |
| 63-151033 | 6/1988 | (JP) . |
| 5-152359 | 6/1993 | (JP) . |
| 8-153752 | 6/1996 | (JP) . |

* cited by examiner

Primary Examiner—Lee Young
Assistant Examiner—Paul D. Kim
(74) Attorney, Agent, or Firm—Hutchins, Wheeler & Dittmar (57) ABSTRACT

A flip chip mounting method and the apparatus have high reliability in electrical connection between a semiconductor and a circuit board so as to avoid void in a via formed in a circuit board or in a recessed portion of a solder resist formed in a circumference of a mounding pad. The flip chip mounting method for connecting a semiconductor element and a circuit board includes steps supplying a thermosetting type resin to a mounting portion on the circuit board, mounting an electrode of the semiconductor element on an electrode of the circuit board under a condition where the semiconductor element is heated by a heating tool, applying a high frequency vibration on the heating tool or the circuit board in the condition where the electrode of the semiconductor element is mounted on the electrode of the circuit board, and heating and pressurizing the thermosetting type resin by the heating tool.

14 Claims, 9 Drawing Sheets

POSITION

CONTACT ULTRASONIC VIBRATION

ULTRASONIC VIBRATION
HEATING AND PRESSURIZIG

FIG.1A

BUMP FORMATION

FIG.1B

CIRCUIT BOARD

FIG.1C

RESIN SUPPLY

FIG.1D

MOUNT

FIG.1E

ULTRASONIC VIBRATION

FIG.1F

HEATING AND PRESSUIRIZING

FIG.1G

COMPLETE

POSITION

FIG.3B

CONTACT ULTRASONIC VIBRATION

FIG.3C

ULTRASONIC VIBRATION HEATING AND PRESSURIZIG

PRIOR ART

FLIP CHIP MOUNTING METHOD AND APPARATUS THEREFOR

BACKGROUND OF THE INVENTION

1. Field of the Invention

The present invention relates to a flip chip mounting method and apparatus therefor for mounting a semiconductor element, such as LSI or so forth on a circuit board.

2. Description of the Related Art

As a method for mounting a bare chip, there has been proposed a pressure welding method. The pressure welding method does not require a supply of a bonding material, such as solder or conductive resin or the like. Electrical connection of an electrode of an LSI and a pad on a circuit board is established only by mechanical contact by shrinking force of a seal resin filled between the LSI and the circuit board.

Process steps of pressure welding are as follow. At first, a seal resin is supplied to a mounting position on the circuit board, where the LSI is to be mounted. Next, on the mounting portion, the LSI is mounted and pressurized. Subsequently, under this condition, heat or light is applied to cure the sealing resin to connect the electrode of the LSI and the pad on the circuit board.

Figure 4A:
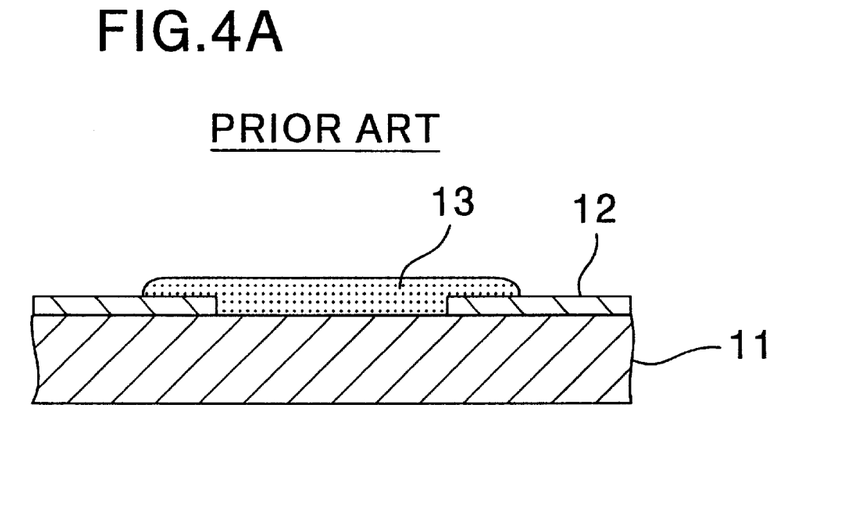
FIGS. 4A to 4C are sections showing a series of process steps of the one typical example of the conventional semiconductor device mounting method, in which are illustrated from initiation to the end.
Figure 4B:
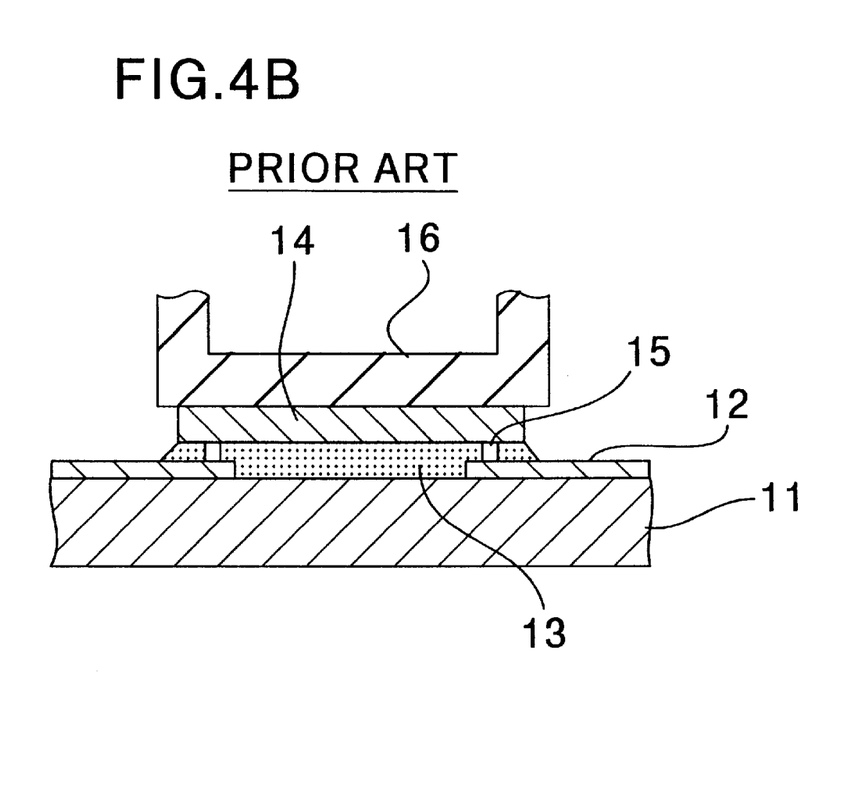
Figure 4C:
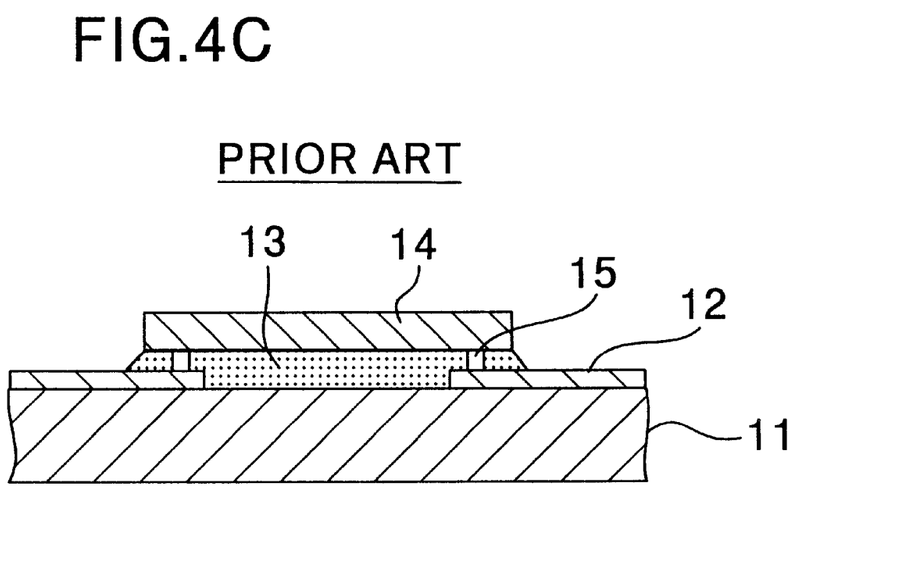

A fabrication process of the semiconductor device disclosed in Japanese Unexamined Patent Publication No. Showa 63-151033 is shown in FIG. 4.

At first, as shown in FIG. 4A, a thermosetting resin 13 is applied on a surface having a conductor wiring 12 of a wiring board 11.

Next, as shown in FIG. 4B, an LSI chip 14 is pressurized onto a wiring board 11 by a pulse heating tool 16 so that a projection electrode 15 on LSI chip 14 and a conductor wire 12, on wiring board 11 match with each other. Upon pressurizing the LSI chip 14, the thermosetting resin 13 on the conductive wiring 12 are pushed out to the circumference. Then, the projection electrode 15 and the conductive wire 12 are electrically contacted. In this condition, by supplying power to the pulse heating tool 16, the pulse heating tool 16 is heated to cure the thermosetting resin 13.

Subsequently, as shown in FIG. 4C, after a while upon termination of heating of the pulse heating tool 16, pressurizing force is released when the temperature is lowered to be lower than or equal to a predetermined value to fix the LSI chip 14 on the wiring board 11 and thus to establish electrical connection between the projection electrode 15 of the LSI chip 14 and the conductive wire 12.

In Japanese Unexamined Patent Publication No. Heisei 5-152359, there has been disclosed a potting apparatus which applies micro vibration to a protective resin during sealing or after sealing to get bubbles generated in the protective resin out or to prevent generation of bubbles initially and thus penetrates the protective resin into a fine gap.

In Japanese Unexamined Patent Publication No. Heisei 8-153752, there has been disclosed a following flip chip mounting method. At first, in a group of an insulation layer provided with a mounting pad of the circuit board, a sealing resin is filled. Next, in this condition, bubble in the circumference of the mounting pas is removed by heating and vacuum defoaming or application of ultrasonic vibration. Subsequently, an amount of the sealing resin is supplied in overlapping manner, and the semiconductor element is mounted.

In the pressure welding method set forth above, since the seal resin is filled between the LSI and the circuit board with flaring by the LSI, the protective resin is difficult to penetrate into the via hole or recessed portion of a solder resist formed on the circumference of the mounting pad. Namely, when flaring speed of the sealing resin is high or when the via hole or the recessed portion is small, the sealing resin flows out without filing into the via or recessed portion to permit residual air within the via or the recessed portion. In the pressure welding method, after flaring the seal resin, the seal resin is heated and cured. The residual air may expand during the process steps set forth above, a gap (hereinafter referred to as "void") is formed between the LSI and the circuit board. The void can cause lower reliability of electrical connection of the LSI and the circuit board due to lowering of fitting force of the LSi and the circuit board and lowering of shrinking force of the sealing resin and so forth. Therefore, it is required to completely avoid the void.

In the potting apparatus disclosed in Japanese Unexamined Patent Publication No. Heisei 5-152359, admixing of the bubble in the protective resin supplied from the nozzle is avoided. Avoiding the bubble residing in the fine groove of the electrode portion of the circuit board is difficult. On the other hand, upon mounting of the LSI on the circuit board, bubble penetrating into the protective resin from a bump can be avoided.

In the flip chip mounting method disclosed in Japanese Unexamined Patent Publication No. Heisei 8-153752, a vacuum drawing process is required to take a long period in operation. On the other hand, when the semiconductor element is mounted on the circuit board, penetration of bubble into the seal resin cannot be avoided.

SUMMARY OF THE INVENTION

The present invention has been worked out for improving the conventional technical problem set forth above. Therefore, it is an object of the present invention to provide a flip chip mounting method and the apparatus therefor having high reliability in electrical connection between a semiconductor and a circuit board so as to avoid voids in a via formed in a circuit board or in a recessed portion of a solder resist formed in a circumference of a mounding pad.

According to the first aspect of the present invention, a flip chip mounting method for connecting a semiconductor element and a circuit board, comprises:

a step of supplying a thermosetting type resin to a mounting portion on the circuit board;

a step of mounting an electrode of the semiconductor element on an electrode of the circuit board under a condition where the semiconductor element is heated by a heating tool;

a step of applying a high frequency vibration on the heating tool or the circuit board in the condition where the electrode of the semiconductor element is mounted on the electrode of the circuit board; and a step of heating and pressurizing the thermosetting type resin by the heating tool.

In the preferred process, connection between the electrode of the semiconductor element and the electrode of the circuit board may be performed by metal diffusion. The thermosetting type resin may be a quick set type resin. The bump electrode formed in the semiconductor element may have a cone shaped tail.

According to the second aspect of the present invention, a flip chip mounting apparatus for connecting a semiconductor element and a circuit board, comprising:

means for supplying a thermosetting type resin to a mounting portion on the circuit board;

means for mounting an electrode of the semiconductor element on an electrode of the circuit board under a condition where the semiconductor element is heated by a heating tool;

means for applying a high frequency vibration on the heating tool or the circuit board in the condition where the electrode of the semiconductor element is mounted on the electrode of the circuit board; and means for heating and pressurizing the thermosetting type resin by the heating tool.

BRIEF DESCRIPTION OF THE DRAWINGS

The present invention will be understood more fully from the detailed description given herebelow and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessarily obscure the present invention.

The first embodiment of the flip chip mounting method according to the present invention will be discussed with reference to FIGS. 1A to 1G. FIGS. 1A to 1G are sections illustrating respective flip chip mounting process steps as being sectioned in a mounting pad portion on the circuit board.

Figure 1A:
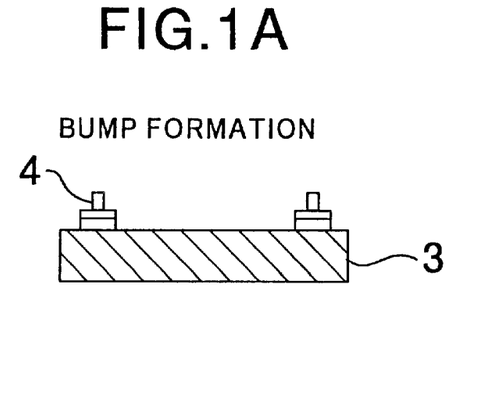
FIGS. 1A to 1G are sections showing a series of process steps of the first and second embodiments of a flip chip mounting method according to the present invention, in which are illustrated respective steps from formation of bump to completion of mounting.

FIG. 1A is a section showing a condition where bump electrodes 4 are formed on an aluminum pad of an LSI 3. Shape and forming method of the bump electrode to be used in the present invention are not particularly specified. However, in the shown embodiment, as shown in FIG. 1A, the bump electrode in the shape having a cone shaped tail is formed by a known ball bonding technology. Dimension of the bump electrode 4 is 70 $\mu$m in height, 85 $\mu$m in diameter and 40 $\mu$m in a tail length, respectively.

Figure 1B:
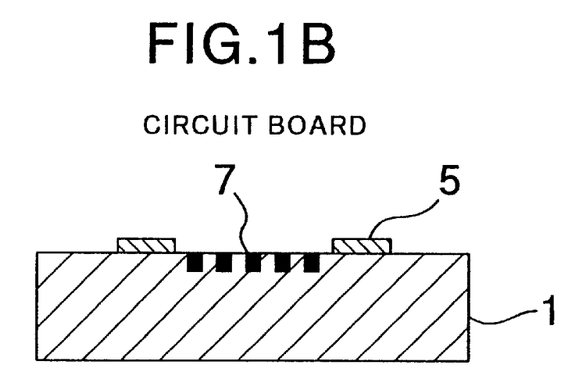

FIG. 1B shows a circuit board 1, on which the LSI 3 is not yet mounted. The kind of the material of the circuit board 1 to be used in the present invention is not particularly specified. However, in the shown embodiment, a printed circuit board produced by a build-up method is employed. A mounting pad 5 on the circuit board 1 is employed. In the printed circuit of this kind, a photo-via is employed in a method for connecting between layers. A via hole 7 formed in this method is closed in a depth of the lower layer portion, different from a through hole extending through entire thickness of the board. On the other hand, while a diameter of the via hole 7 is not specified, the shown embodiment employs the via hole 7 having 100 $\mu$m of diameter.

Figure 1C:
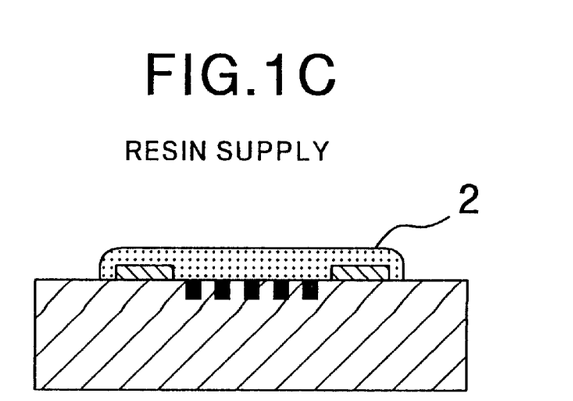

FIG. 1C shows a condition where a thermosetting resin 1 is supplied to a mounting portion on the circuit board 2. As a supply method of the thermosetting resin, a screen printing method is employed in the shown embodiment. However, the supply method of the resin is not limited to the screen printing, but a known dispenser can be employed. On the other hand, as the thermosetting resin 2, an epoxy type thermosetting type quick set resin having a value of shrinking ratio greater than a value of thermal expansion ratio is employed. This resin completes setting at 200° C. for about 30 sec.

Figure 1D:
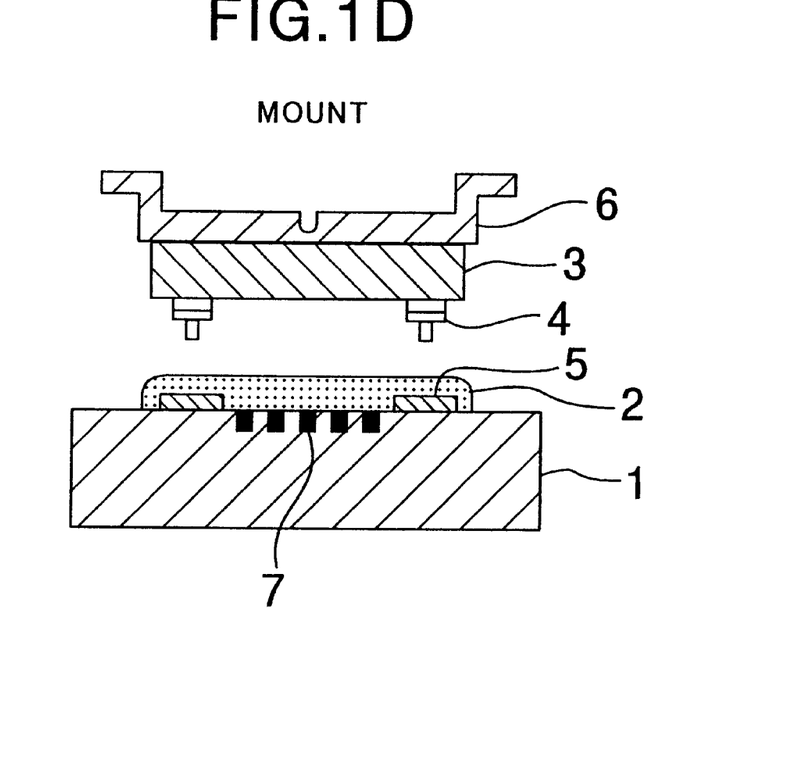

FIG. 1D shows a condition, in which the bump electrode 4 of the LSI 3 heated to a predetermined temperature and a mounting pad 5 on the circuit board 1 heating at a predetermined temperature are positioned with each other for mounting the LSI 3 on the circuit board 1. On the LSI 3, a pulse heating tool heated by receiving supply of a pulse signal is mounted.

The pulse heating tool 6 is constructed by forming a resistor on a ceramic matrix. The pulse heating tool 6 has a temperature control function controlling a pulse width for heating up to a set temperature by supplying the pulse signal to the resistor.

The LSI 3 is heated by the pulse heating tool 6. Temperatures for heating the LSI 3 and the circuit board 1 are not particularly specified but a temperature where viscosity of thermosetting resin 2 becomes minimum is preferred. In the shown embodiment, the temperature is 70° C.

On the other hand, a mounting load may be a pressure in the extent where a tip end of the cone shaped tail of each bump electrode 4 of the LSI 3 contacts with the mounting pad 5 on the circuit board 1. In this process step, the thermosetting resin does not penetrate into the via hole 7 on the circuit board 1 to leave the air within the via hole.

Figure 1E:
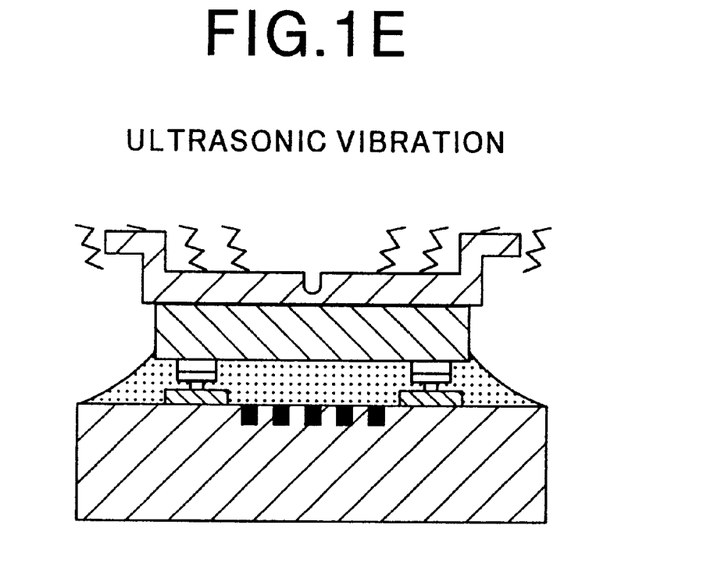

FIG. 1E is a condition where a ultrasonic vibration is applied to the pulse heating tool 6 after mounting the LSI 3 on the circuit board 1. Hereinafter, the word "ultrasonic vibration" is used for representing high frequency vibration and can be used for representing high frequency and low amplitude vibration. By applying the ultrasonic vibration on the pulse heating tool 6, the thermosetting resin is also vibrated to remove air from the via hole 7 to fill the thermosetting resin into the via hole 7. A frequency of the ultrasonic wave is preferred to be higher than or equal to 50 kHz. However, the frequency of the ultrasonic wave is not specified. Viscosity and wetting ability of the thermosetting resin 2 and surface condition of the circuit board 1 may be set arbitrarily.

Figure 1F:
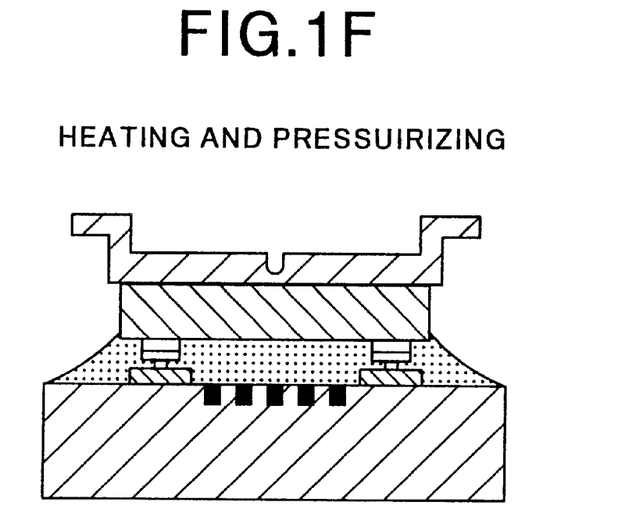

FIG. 1F shows a condition where the LSI 3 is heated and pressurized. Here, a pressurizing force is in the extent for completely crushing the cone shaped tail of the bump electrode 4 on the mounting pad 5. In the shown embodiment, the pressurizing force is set at 30 g per one bump electrode. On the other hand, the heating temperature is 200° C. on the side of LSI 3, 80° C. on the side of the circuit board 1. A period for holding the LSI 3 and the mounting pad 5 are held heated and pressurized is 30 sec.

Figure 1G:
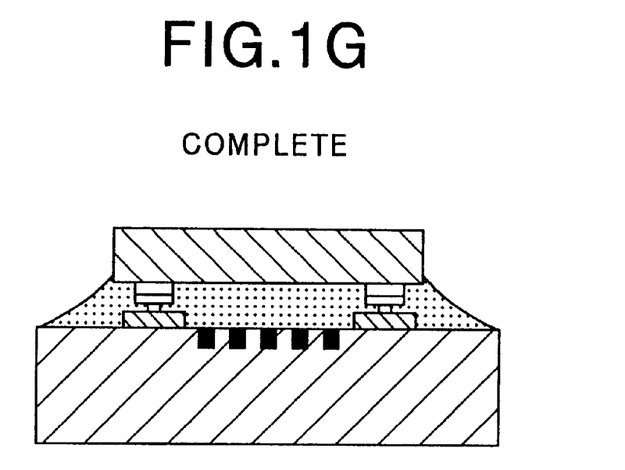

FIG. 1G shows a condition where the foregoing mounting process is completed. As a result, the circuit board mounted the LSI can be obtained without forming void and with establishing electrical connection between the bump electrode and the mounting pad 5 by the shrinking force of the thermosetting resin 2.

In the mounting process set forth above, operation from removal of the residual air within the via hole 7 and filing the thermosetting resin 2 is filled within the via hole 7 by application of ultrasonic vibration of FIG. 1E to obtain the circuit board mounted the LSI 3, will be discussed with reference to FIGS. 2A to 2E.

Figure 2A:
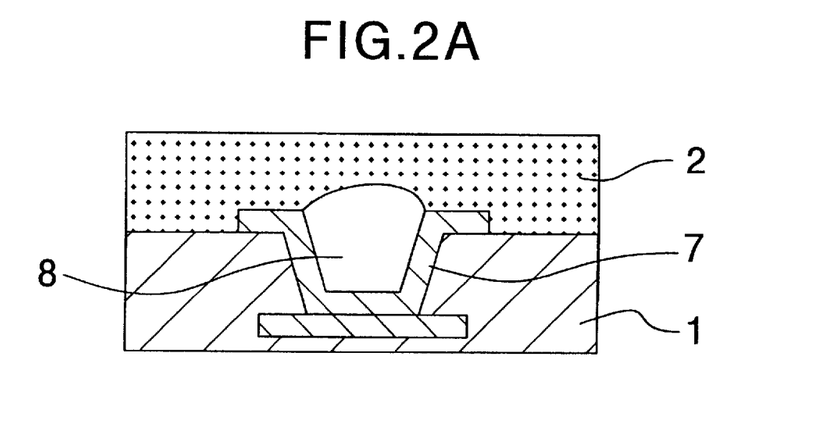
FIGS. 2A to 2E are sections showing a series of major process steps in the first embodiment of the flip chip mounting method according to the present invention, in which are illustrated respective steps from a condition where residual air is present within a via hole to completion of mounting to obtain a circuit board mounted with an LSI.
Figure 2B:
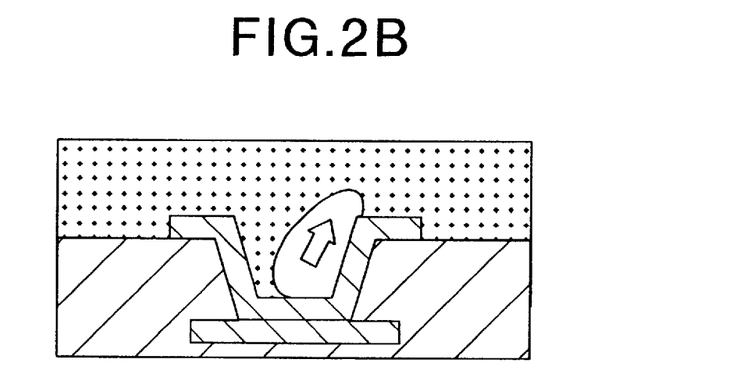
Figure 2C:
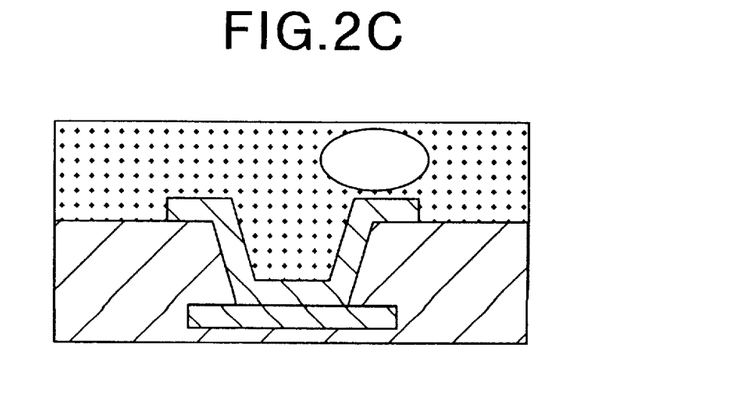

By application of the ultrasonic vibration in the step of FIG. 1E, the thermosetting resin penetrates into the via hole 7 with wetting the inner wall thereof in conditions from FIG. 2A to FIG. 2B. Finally, as shown in FIG. 2C, the thermosetting resin 2 penetrates into the via hole 7 with wetting the entire inner wall. As a result, residual air 8 in the via hole can be removed by replacing with the thermosetting resin 2.

Figure 2D:
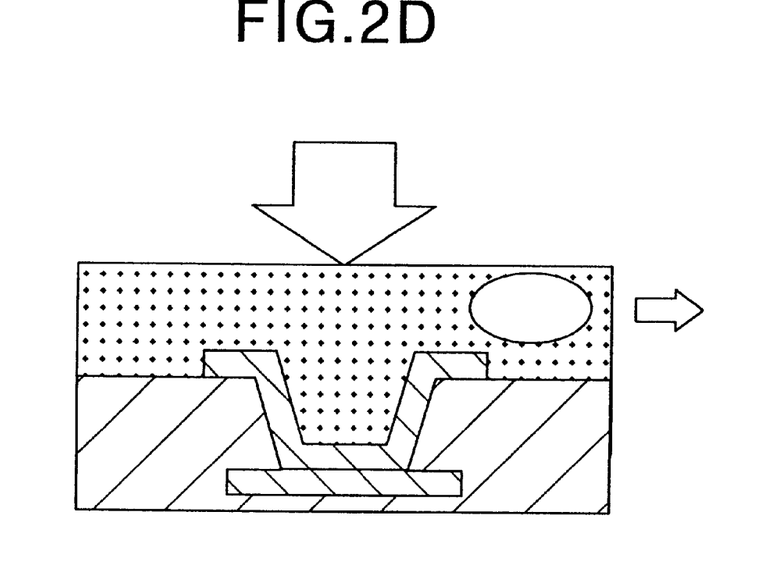
Figure 2E:
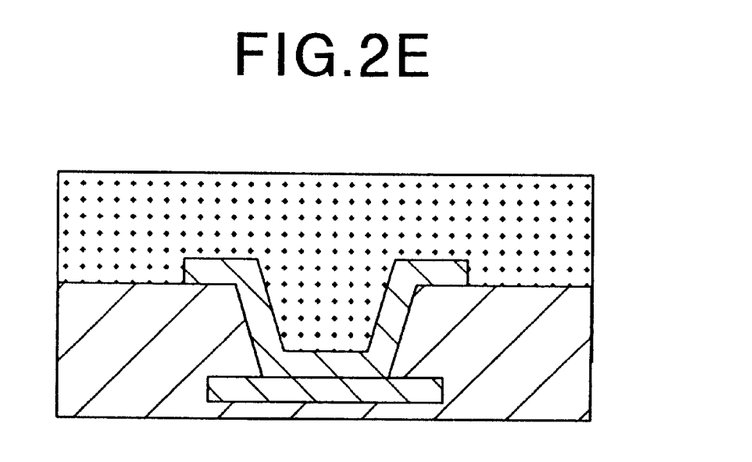

At this time, the air 8 thus removed may reside within the thermosetting resin 2 between the LSI 3 and the circuit boad. However, by application of pressure in a direction of arrow for the thermosetting resin 2 in the next step (heating and pressurizing step of FIG. iF) as illustrated in FIG. 2D, the air 8 is pushed out of mounting area of the LSI 3. Accordingly, as shown in FIG. 2E, air 8 may not reside between the LSI 3 and the circuit board 1. Therefore, the circuit board mounted with the LSI 3 without any void can be obtained.

Next, a series of the process steps of the second embodiment of the flip chip mounting method according to the present invention will be discussed with reference to FIGS. 1A to 1G. FIGS. 1A to 1G are sections illustrating respective of the second embodiment of the flip chip mounting process steps as being sectioned in a mounting pad portion on the circuit board.

FIG. 1A is a section showing a condition where bump electrodes 4 are formed on an aluminum pad of an LSI 3. Shape and forming method of the bump electrode to be used in the present invention are not particularly specified. However, in the shown embodiment, as shown in FIG. 1A, the bump electrode in the shape having a cone shaped tail is formed by a known ball bonding technology. Dimension of the bump electrode 4 is 70 µm in height, 85 µm in diameter and 40 µm in a tail length, respectively. On the other hand, the material of the bump electrode 4 is not particularly specified but is gold of 99.99% of purity, in the shown embodiment.

FIG. 1B shows a circuit board 1, on which the LSI 3 is not yet mounted. The kind of the material of the circuit board 1 to be used in the present invention is not particularly specified. However, in the shown embodiment, a printed circuit board produced by a build-up method is employed. A mounting pad 5 on the circuit board 1 is employed. The surface of the mounting pad 5 is finished by gold plating with 0.3 µm of plated layer thickness. Kind of the metal for performing surface proess is not particularly limited. However, the metal of the plating easily form alloy with the metal forming the bump electrode 4 is preferred. On the other hanbd, in the printed circuit board of this kind, a photo-via is employed in a method for connecting between layers. A via hole 7 formed in this method is closed in a depth of the lower layer portion, different from a through hole extending through entire thickness of the board. On the other hand, while a diameter of the via hole 7 is not specified, the shown embodiment employs the via hole 7 having 100 µm of diameter.

FIG. 1C shows a condition where a thermosetting resin 2 is supplied to a mounting portion on the circuit board 2. As a supply method of the thermosetting resin, a screen printing method is employed in the shown embodiment. However, the supply method of the resin is not limited to the screen printing, but a known dispenser can be employed. On the other hand, as the thermosetting resin 2, an epoxy type thermosetting type quick set resin having a value of shrinking ratio greater than a value of thermal expansion ratio is employed. This resin completes setting at 200° C. for about 30 sec.

FIG. 1D shows a condition, in which the bump electrode 4 of the LSI 3 heated to a predetermined temperature and a mounting pad 5 on the circuit board 1 heating at a predetermined temperature are positioned with each other for mounting the LSI 3 on the circuit board 1. On the LSI 3, a pulse heating tool heated by receiving supply of a pulse signal is mounted. Temperatures for heating the LSI 3 and the circuit board 1 are not particularly specified but a temperature where viscosity of thermosetting resin 2 becomes minimum is preferred. In the shown embodiment, the temperature is 70° C.

On the other hand, a mounting load may be a pressure in the extent where a tip end of the cone shaped tail of each bump electrode 4 of the LSI 3 contacts with the mounting pad 5 on the circuit board 1. In this process step, the thermosetting resin does not penetrate into the via hole 7 on the circuit board 1 to leave the air within the via hole.

FIG. 1E is a condition where a ultrasonic vibration is applied to the pulse heating tool 6 after mounting the LSI 3 on the circuit board 1. By applying the ultrasonic vibration on the pulse heating tool 6, the thermosetting resin is also vibrated to remove air from the via hole 7 to fill the thermosetting resin into the via hole 7. A frequency of the ultrasonic wave is preferred to be higher than or equal to 50 kHz. However, the frequency of the ultrasonic wave is not specified. Viscosity and wetting ability of the thermosetting resin 2 and surface condition of the circuit board 1 may be set arbitrarily.

FIG. 1F shows a condition where the LSI 3 is heated and pressurized. Here, a pressurizing force is in the extent for completely crushing the cone shaped tail of the bump electrode 4 on the mounting pad 5. In the shown embodiment, the pressurizing force is set at 30 g per one bump electrode. On the other hand, the heating temperature is 240° C. on the side of LSI 3, 80° C. on the side of the circuit board 1. A period for holding the LSI 3 and the mounting pad 5 are held heated and pressurized is 30 sec. In the shown embodiment, since the heating temperature is set at 240° C. which is higher than that of the first embodiment, the bump electrode 4 and the mounting pad 5 are connected by metal diffusion by deformation of the bump electrode 4, ultrasonic vibration and heating and pressurization, at this time.

FIG. 1G shows a condition where the foregoing mounting process is completed. As a result, the circuit board mounted the LSI can be obtained without forming void and with metal coupling.

Subsequently, discussion will be given for operation in the second embodiment, in which the thermosetting resin 2 on the mounting pad 5 is removed by the bump electrode 4 having the cone shaped tail and subsequently, connection between the bump electrode 4 and the mounting pad 5 is established by ultrasonic vibration shown in FIG. 1E and heating and pressurizing shown in FIG. 1F, with reference to FIGS. 3A to 3C.

Figure 3A:
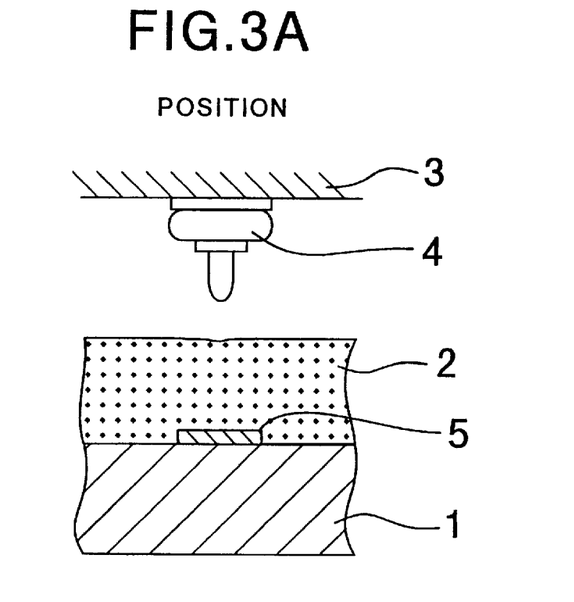
FIGS. 3A to 3C are sections showing a series of major process steps in the second embodiment of the flip chip mounting method according to the present invention, in which are illustrated respective steps to obtain electrical connection between a bump electrode of the LSI and a mounting pad of the circuit board.
Figure 3B:
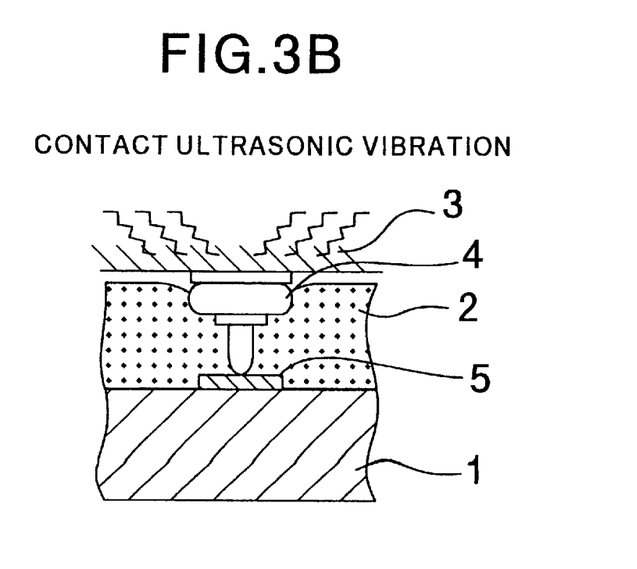
Figure 3C:
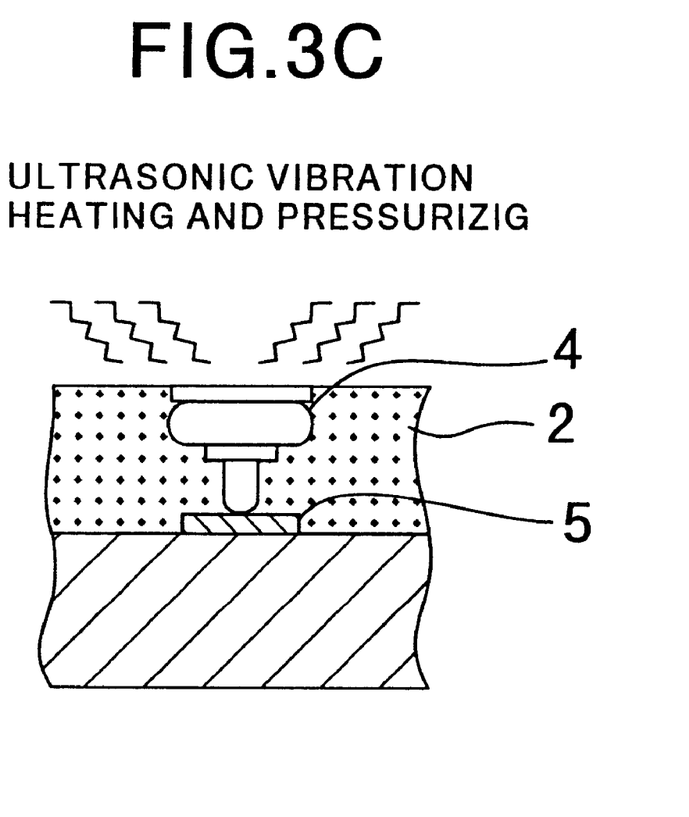

As shown in FIG. 3A, it is considered that the thermosetting resin 2 is present on the mounting pad 5 upon positioning and mounting of the LSI on the circuit board. Upon pressurization is initiated upon mounting of the LSI on the circuit board, the cone shaped tail moves toward the the mating surface of the circuit board with slashing the thermosetting resin 2 to contact the tip end thereof onto the mounting pad 5. From this condition, ultrasonic vibration is applied and pressurizing is progressed in the pressurizing and heating step, the tip end of the cone shaped tail is crushed by the load as shown in FIG. 3C. Thus, shape of the contact is varied from point to area.

By this deformation, the thermosetting resin 2 on the mounting pad 5 can be removed completely to expose a fresh metal surface. In conjunction therewith, metal diffusion by ultrasonic vibration, heating and pressurizing is progressed to obtain electrical connection with high reliability by alloying of the contact surfaces of the bump electrode 4 and the mounting pad 5.

With the present invention, the following effects can be achieved.

1. Residual air is removed from the via hole formed in the circuit board and from the recessed portion of the solder resist formed along the circumferencial edge of the mounting pad, and the thermosetting resin is filled in place. Therefore, voids will never be caused. Therefore, the flip chip mounting method and apparatus having high reliability of electrical connection between the semiconductor element and the circuit board can be provided.

2. By deformation of the bump electrode with the cone shaped tail and application of ultrasonic vibration, the bump electrode of the semiconductor element and the mounting pad of the circuit board are worn to expose the fresh metal surface to generate an alloy layer between the bump electrode of the semiconductor element and the mounting pad of the circuit board. Thus, the semiconductor element and the circuit board are firmly connected.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

For instance, in the foregoing first and second embodiments, ultrasonic vibration is applied to the pulse heating tool 6 on the side of the LSI 3. However, the design can be modified to apply the ultrasonic vibration on the side of the circuit board 1.

On the other hand, in the first and second embodiments, ultrasonic vibration application step of FIG. 1E and heating and pressurizing step of FIG. 1F are performed at different timing. However, ultrasonic vibration application step of FIG. 1E and heating and pressurizing step of FIG. 1F may be performed simultaneously. In this case, a process period of the heating and pressurizing process step is longer than the ultrasonic wave applying step. Therefore, the ultrasonic wave applying process may be completed at earlier timing.

On the other hand, while the pulse heating tool is employed as the heating tool of the LSI in the shown embodiment, any heating tool may be used as long as temperature can be controlled.

Also, the particular numerical value of the heating temperature and pressure are variable depending upon material of the thermosetting resin. However, heating temperature and pressure are not limited to the particular values in the shown embodiments.

On the other hand, in the first and second embodiments, discussion has been given only for the case where air 8 resides within the via hole 7 of the circuit board. However, air may also reside in a recessed portion of the solder resist formed on the circumference of the mounting pad 5. According to the present invention, the residual air in the recessed portion of the solder resist in the process steps of FIGS. IA to 1G can also be removed to fill with the thermosetting resin.

What is claimed is:

1. A flip chip mounting method for connecting a semiconductor element and a circuit board, comprising:
a step of supplying a thermosetting type resin over a recessed portion on said circuit board;
a step of mounting said semiconductor element on said circuit board by said thermosetting resin under a condition where said semiconductor element is heated by a heating tool;
a step of applying a high frequency vibration on said heating tool in the condition where an electrode of said semiconductor element is mounted for filling said thermosetting type resin within said recessed portion and for removing air from said recessed portion; and
a step of heating and pressurizing said thermosetting type resin by said heating tool.

2. A flip chip mounting method as set forth in claim 1, wherein connection between a bump electrode of said semiconductor element and an electrode of said circuit board are performed by metal diffusion.

3. A flip chip mounting method as set forth in claim 1, wherein a bump electrode formed in said semiconductor element has a cone shaped tail, said tail portion being crushed for connecting said bump electrode to an electrode of said circuit board upon pressurizing and heating said thermosetting type resin by pushing against said semiconductor element by means of said heating tool.

4. A flip chip mounting method as set forth in claim 1, wherein connection between a bump electrode of said semiconductor element and an electrode of said circuit board are performed by metal diffusion, and the bump electrode formed in said semiconductor element has a cone shaped tail, said tail portion being crushed for connecting said bump electrode to said electrode of said circuit board upon pressurizing and heating said thermosetting type resin by pushing against said semiconductor element by means of said heating tool.

5. A flip chip mounting method as set forth in claim 1, wherein said thermosetting type resin is a quick set type resin and connection between a bump electrode of said semiconductor element and an electrode of said circuit board are performed by metal diffusion.

6. A flip chip mounting method as set forth in claim 1, wherein said thermosetting type resin is a quick set type resin, connection between the electrode of said semiconductor element and an electrode of said circuit board are performed by metal diffusion, and a bump electrode formed in said semiconductor element has a cone shaped tail, said tail portion being crushed for connecting said bump electrode to said electrode of said circuit board upon pressurizing and heating said thermosetting type resin by pushing on said semiconductor element by means of said heating tool.

7. A flip chip mounting method as set forth in claim 1, wherein said recessed portion on said circuit board is a via, and said thermosetting type resin fills said via.

8. A flip chip mounting apparatus for physically and electrically connecting a semiconductor element and a circuit board, comprising:

means for supplying a thermosetting type resin over a recessed portion on said circuit board;

means for mounting said semiconductor element on said circuit board by said thermosetting resin under a condition where said semiconductor element is heated by a heating tool;

means for applying a high frequency vibration on said heating tool in the condition where an electrode of said semiconductor element is mounted for filling said thermosetting type resin within said recessed portion and for removing air from said recessed portion; and means for heating and pressurizing said thermosetting type resin by said heating tool.

9. A flip chip mounting apparatus as set forth in claim 8, wherein connection between a bump electrode of said semiconductor element and an electrode of said circuit board are performed by metal diffusion with high frequency vibration and pressuring and heating.

10. A flip chip mounting apparatus as set forth in claim 8, wherein a bump electrode formed in said semiconductor element has a cone shaped tail, said tail portion being crushed for connecting said bump electrode to an electrode of said circuit board upon pressurizing and heating said thermosetting type resin by pushing on said semiconductor element by means of said heating tool having a predetermined pressure.

11. A flip chip mounting apparatus as set forth in claim 8, wherein connection between the electrode of said semiconductor element and an electrode of said circuit board are performed by metal diffusion, and a bump electrode formed in said semiconductor element has a cone shaped tail, said tail portion being crushed for connecting said bump electrode to an electrode of said circuit board upon pressurizing and heating said thermosetting type resin by pushing said semiconductor element by means of said heating tool.

12. A flip chip mounting apparatus as set forth in claim 8, wherein said thermosetting type resin is a quick set type resin and connection between a bump electrode of said semiconductor element and an electrode of said circuit board are performed by metal diffusion with high frequency vibration and pressurizing and heating.

13. A flip chip mounting apparatus as set forth in claim 8, wherein said thermosetting type resin is a quick set type resin, connection between a bump electrode of said semiconductor element and an electrode of said circuit board are performed by metal diffusion, and the bump electrode formed in said semiconductor element has a cone shaped tail, said tail portion being crushed for connecting said bump electrode to said electrode of said circuit board upon pressurizing and heating said thermosetting type resin by pushing said semiconductor by means of said heating tool.

14. A flip chip mounting apparatus as set forth in claim 8, wherein said recessed portion on said circuit board is a via, and said thermosetting type resin fills said via.

* * * * *